(12) United States Patent
Morita

(10) Patent No.: US 11,695,391 B2
(45) Date of Patent: Jul. 4, 2023

(54) BIQUAD FILTER

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Makoto Morita, Zushi (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/467,116

(22) Filed: Sep. 3, 2021

(65) Prior Publication Data

US 2022/0069805 A1  Mar. 3, 2022

(30) Foreign Application Priority Data

Sep. 3, 2020 (JP) .................................. 2020-148331

(51) Int. Cl.
  *H03H 11/12* (2006.01)
(52) U.S. Cl.
  CPC .............................. *H03H 11/1226* (2013.01)
(58) Field of Classification Search
  CPC .................................................. H03H 11/1226
  See application file for complete search history.

(56) References Cited

U.S. PATENT DOCUMENTS

| | | | |
|---|---|---|---|
| 7,010,025 B1* | 3/2006 | Helfenstein | H04B 3/03 |
| | | | 343/822 |
| 9,847,771 B2 | 12/2017 | Taya | |
| 2006/0003861 A1 | 2/2006 | Gudem et al. | |
| 2006/0038610 A1* | 2/2006 | Gudem | H03H 11/1252 |
| | | | 327/552 |
| 2017/0254644 A1 | 9/2017 | Kanemoto | |
| 2021/0409041 A1* | 12/2021 | Abbas Mohamed Helmy | |
| | | | H03H 19/004 |

FOREIGN PATENT DOCUMENTS

| JP | 6-21758 A | 1/1994 |
|---|---|---|
| JP | 8-256040 A | 10/1996 |
| JP | 2008-511207 A | 4/2008 |
| JP | 2014-204286 A | 10/2014 |
| JP | 2015-12332 A | 1/2015 |
| JP | 2017-34533 A | 2/2017 |
| JP | 2017-156314 A | 9/2017 |

* cited by examiner

*Primary Examiner* — Daniel C Puentes
(74) *Attorney, Agent, or Firm* — Allen & Overy LLP

(57) ABSTRACT

According to one embodiment, in a biquad filter, an output terminal of a first integrator is connected to an input terminal in a negative pole side of a second integrator, an output terminal of the first integrator is connected to a first input terminal in a negative pole side of an adder through the inversion amplifier, an output terminal of the second integrator is connected to a second input terminal in the negative pole side of the adder, an input terminal to which an input signal is input is connected to a third input terminal in the negative side of the adder, and an output terminal of the adder is connected to an input terminal in a negative pole side of the first integrator.

14 Claims, 7 Drawing Sheets

BIQUAD FILTER

CROSS-REFERENCE TO RELATED APPLICATIONS

This application is based upon and claims the benefit of priority from Japanese Patent Application No. 2020-148331, filed Sep. 3, 2020, the entire contents of which are incorporated herein by reference.

FIELD

Embodiments described herein relate generally to a biquad filter.

BACKGROUND

In recent years, filters to remove unnecessary signals in communication devices have been developed.

DETAILED DESCRIPTION

Figure 1:
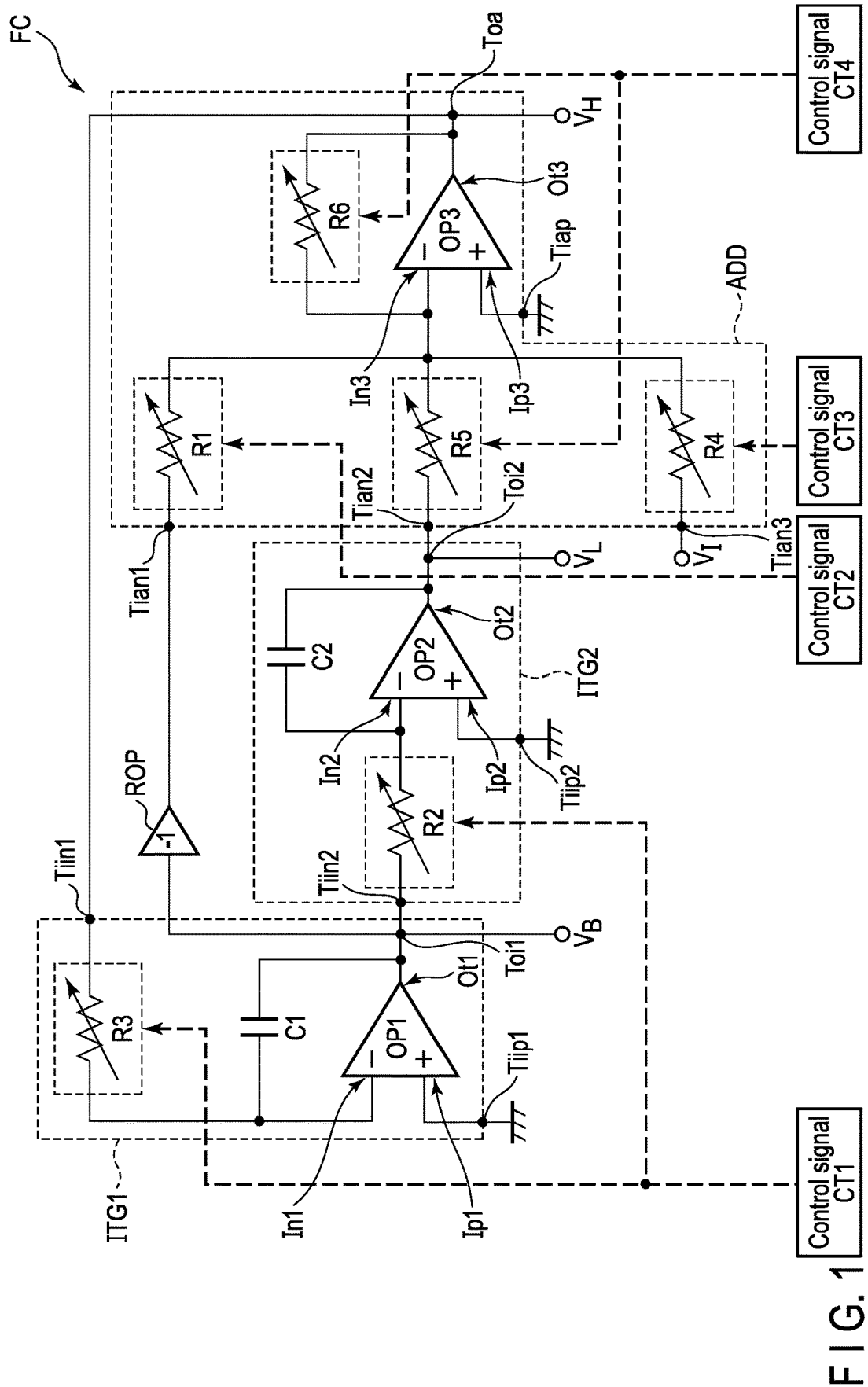
FIG. 1 is a circuit diagram illustrating a biquad filter of a first embodiment.

In general, according to one embodiment, a biquad filter includes a first integrator including a first operational amplifier, and a first variable resistor and a first condenser connected to the first operational amplifier; a second integrator including a second operational amplifier, and a second variable resistor and a second condenser connected to the second operational amplifier; an adder including a third operational amplifier and a plurality of resistors connected to the third operational amplifier; and an inversion amplifier having a 1× amplification rate, wherein an output terminal of the first integrator is connected to an input terminal in a negative pole side of the second integrator, the output terminal of the first integrator is connected to a first input terminal in a negative pole side of the adder through the inversion amplifier, an output terminal of the second integrator is connected to a second input terminal in the negative pole side of the adder, an input terminal to which an input signal is input is connected to a third input terminal in the negative side of the adder, and an output terminal of the adder is connected to an input terminal in a negative pole side of the first integrator.

In conventional biquad filters, parameters such as center frequency, cut-off frequency, sharpness, and pass gain are adjusted by changing a capacitance value of condensers, and a resistance value of resistors of the biquad filter.

Note that, from a view point of decreasing a chip area in, for example, a semiconductor integrated circuit, such parameters are, preferably, adjusted based only on the resistance value of resistors. However, when the parameters are adjusted based only on the resistance value of the resistors, a change to the resistance value related to a certain parameter (for example, frequency) may cause a change of another parameter (for example, sharpness), which is problematic.

The embodiments of the present application present a biquad filter which can independently adjust parameters.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention.

In addition, in the specification and drawings, the same elements as those described in connection with preceding drawings are denoted by the same reference numbers, and detailed descriptions thereof are omitted unless necessary.

In the following description, a biquad filter of an embodiment will be explained with reference to the accompanying drawings.

First Embodiment

FIG. 1 is a circuit diagram of a biquad filter of First embodiment. The biquad filter FC of FIG. 1 includes an operational amplifier OP1, operational amplifier OP2, operational amplifier OP3, resistor R1, resistor R2, resistor R3, resistor R4, resistor R5, resistor R6, condenser C1, condenser C2, and an inversion amplifier ROP with an amplification rate of 1×. The BIQUAD filter FC of FIG. 1 includes an input terminal VI of the BIQUAD filter FC, output terminal VB of a band-pass filter, output terminal VL of a low-pass filter, and output terminal VH of a high-pass filter.

The biquad filter FC of the present embodiment includes a first integrator ITG1, second integrator ITG2, adder ADD, and inversion amplifier ROP with an amplification rate of 1×. In the biquad filter FC of FIG. 1, the first integrator ITG1 includes the operational amplifier OP1, resistor R3, and condenser C1. The adder ADD includes the operational amplifier OP3 and a plurality of resistors, specifically, resistor R1, resistor R4, resistor R5, and resistor R6.

An output terminal Toi1 of the first integrator ITG1 is connected to the output terminal VB. The output terminal Toi1 of first integrator ITG1 is connected to an input terminal Tiin2 in a negative pole side of the second integrator ITG2. The output terminal Toi1 of the first integrator ITG1 is connected to a first input terminal Tian1 in the negative pole side of the adder ADD through the inversion amplifier ROP.

The output terminal Toi2 of the second integrator ITG2 is connected to the output terminal VL. The output terminal Toi2 of the second integrator ITG2 is connected to the second input terminal Tian2 in the negative pole side of the adder ADD.

The input terminal VI to which an input signal is input, is connected to the third input terminal Tian3 in the negative pole side of the adder ADD. The output terminal Toa of the adder ADD is connected to an output terminal VH. The output terminal Toa of the adder ADD is connected to the input terminal Tiin1 in the negative pole side of the first integrator ITG1.

The positive input terminal Tiip1 of the first integrator ITG1, the positive input terminal Tiip2 of the second integrator ITG2, and the positive input terminal Tiap of the adder ADD are grounded.

In the biquad filter FC of FIG. 1, the resistors R1, R2, R3, R4, R5, and R6 are variable resistors. The resistors R2 and R3 change resistance values thereof based on the control signal CT1 from the outside. The resistor R1 changes resistance value thereof based on the control signal CT2 from the outside. The resistor R4 changes resistance value thereof based on the control signal CT3 from the outside. The resistors R5 and R6 change resistance values thereof based on the control signal CT4 from the outside.

Note that, only resistors R2 and R3 may be variable resistors, and the other resistors, i.e., resistors R1, R4, R5, and R6, may be fixed resistors. The details will be described later.

In the present embodiment, operational amplifier OP1, resistor R3 as a variable resistor, and condenser C1 may be referred to as first operational amplifier, first variable resistor, and first condenser, respectively. Operational amplifier OP2, resistor R2 as a variable resistor, and condenser C2 may be referred to as second operational amplifier, second variable resistor, and second condenser, respectively. The operational amplifier OP3 may be referred to as third operational amplifier. The resistors R1, R5, and R4 of the adder ADD may be referred to as third, fourth, and fifth resistors, respectively, or may be referred to as first, second, and third resistors of the adder ADD.

In the following description, the resistance values of resistors R1, R2, R3, R4, R5, and R6 will be referred to as resistance values R1, R2, R3, R4, R5, and R6, respectively. Similarly, the capacitance values of condenser C1 and C2 will be referred to as capacitance values C1 and C2, respectively.

Specifically, an output terminal Ot1 of the operational amplifier OP1 is connected to one terminal of the condenser C1, one terminal of the resistor R2, output terminal VB, and input terminal of the inversion amplifier ROP. An input terminal In1 in the negative pole side of the operational amplifier OP1 is connected to the other terminal of condenser C1 and one terminal of resistor R3. An input terminal Ip1 in the positive pole side of the operational amplifier OP1 is grounded.

An output terminal Ot2 of the operational amplifier OP2 is connected to one terminal of the condenser C2, one terminal of the resistor R5, and the output terminal VL. An input terminal In2 in the negative pole side of the operational amplifier OP2 is connected to the other terminal of the resistor R2 and the other terminal of the condenser C2. An input terminal In2 in the negative pole side of the operational amplifier OP2 is connected to the other terminal of the resistor R2 and the other terminal of the condenser C2. An input terminal Ip2 in the positive pole side of the operational amplifier OP2 is grounded.

An output terminal Ot3 of the operational amplifier OP3 is connected to one terminal of the resistor R6, the other terminal of resistor R3, and the output terminal VH. An input terminal In3 in the negative pole side of the operational amplifier OP3 is connected to the other terminal of resistor R6, the other terminal of resistor R5, one terminal of resistor R4, and one terminal of resistor R1. An input terminal Ip3 in the positive pole side of the operational amplifier OP3 is grounded.

An output terminal of the inversion amplifier ROP is connected to the other terminal of the resistor R1.

The other terminal of resistor R4 is connected to the input terminal VI.

An output terminal Toi1 of the first integrator ITG1 is connected to the output terminal Ot1 of the operational amplifier OP1, one terminal of the condenser C2, one terminal of the resistor R2, input terminal of the inversion amplifier ROP, and output terminal VB. The input terminal Tiin1 in the negative pole side of first integrator ITG1 includes the other terminal of resistor R3 and is connected to the input terminal In1 in the negative pole side of the operational amplifier OP1 via the resistor R3.

An output terminal Toi2 of the second integrator ITG2 is connected to the output terminal Ot2 of the operational amplifier OP2, one terminal of the condenser C2, one terminal of the resistor R5, and the output terminal VL. The input terminal Tiin2 in the negative pole side of the second integrator ITG2 includes one terminal of the resistor R2 and is connected to the input terminal In2 in the negative pole side of the operational amplifier OP2 via the resistor R2.

The output terminal Toa of the adder ADD is connected to the output terminal Ot3 of the operational amplifier OP3, one terminal of the resistor R6, the other terminal of the resistor R3, and the output terminal VH. The first input terminal Tian1 in the negative pole side of the adder ADD includes the other terminal of the resistor R1. The second input terminal in the negative pole side of the adder ADD includes one terminal of resistor R5. The third input terminal in the negative pole side of the adder ADD includes the other terminal of resistor R4. The first input terminal Tian1, second input terminal Tian2, and third input terminal Tian3 in the negative pole side of the adder ADD are connected to the input terminal In3 in the negative pole side of the operational amplifier OP3 via resistors R1, R5, and R4, respectively.

Note that, the output terminals Toi1 of first integrator ITG1, Toi2 of second integrator ITG2, and Toa of the adder ADD can be interpreted to include the output terminals Ot1 of the operational amplifier OP1, Ot2 of operational amplifier OP2, and Ot3 of operational amplifier OP3, respectively. This is because signals output from the output terminals of first integrator ITG1, second integrator ITG2, and adder ADD are equivalent to the signals output from the output terminals of operational amplifier OP1, operational amplifier OP2, and operational amplifier OP3, respectively.

Figure 2:
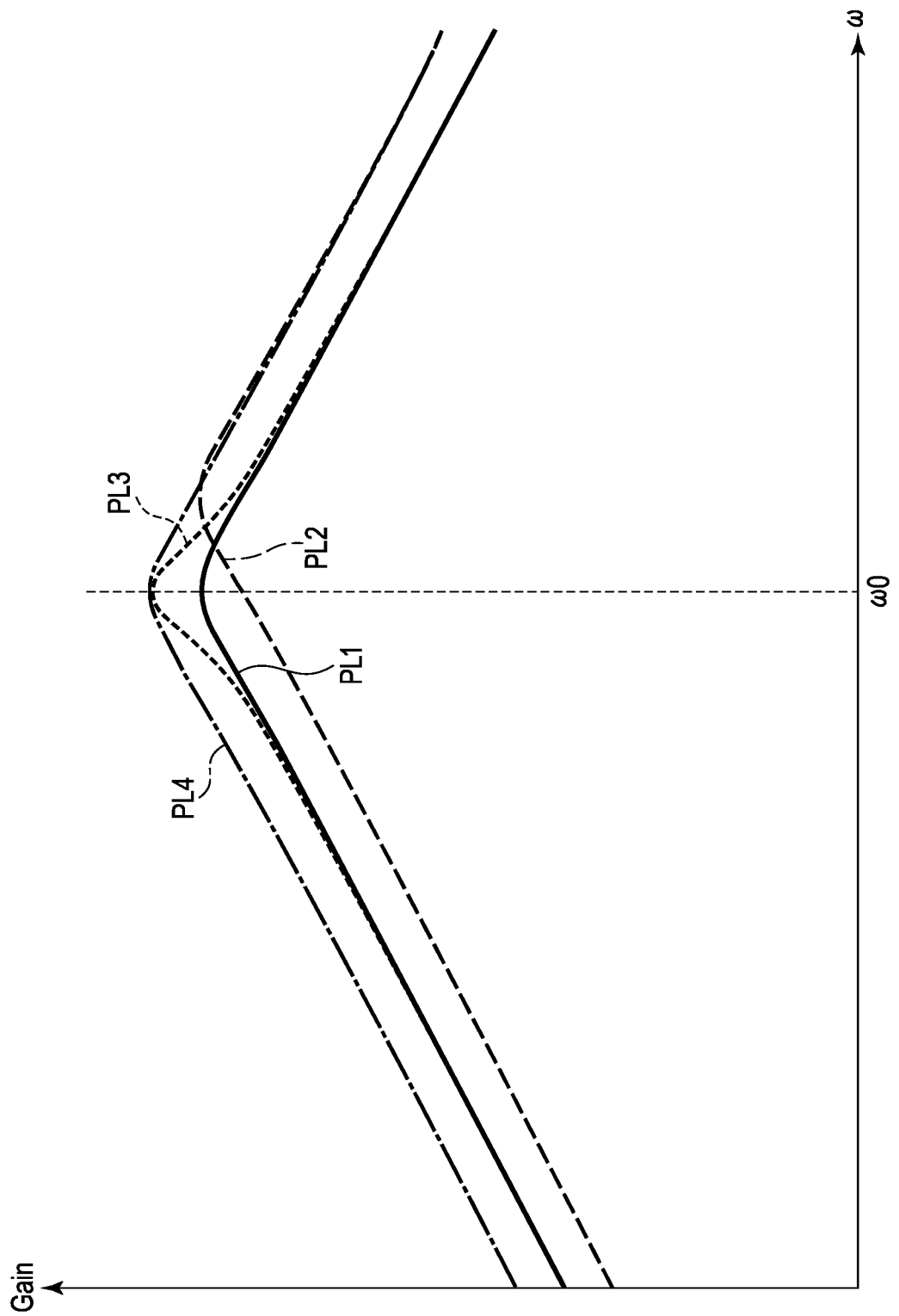
FIG. 2 is a diagram illustrating an operation of the biquad filter of the first embodiment, functioning as a band-pass filter.

FIG. 2 illustrates an operation of the biquad filter FC of the first embodiment as a band-pass filter.

In FIG. 1, if the signal input to the input terminal VI is vI and the signal output from the output terminal VB is vB, the transfer function as a band-pass filter is (Formula 1).

$$v_B/v_I = H\omega_0/Qs/s^2 + \omega_0/Qs + \omega_0^2 = R_6/R_4 \cdot 1/C_1R_3 \cdot s/s^2 + 1/C_1R_3 \cdot R_6/R_1 s + 1/C_1C_2R_2R_3 \cdot R_6/R_5 \quad \text{(Formula 1)}$$

Note that, in (Formula 1), $\omega 0$ denotes the center frequency, Q denotes the sharpness, and H denotes the pass gain.

If, in (Formula 1), C1=C2=C12, R2=R3=R23, R5=R6=R56, the parameters of the transfer function, center frequency ω0, sharpness Q, and pass gain H can be expressed in (Formula 2).

$$v_B/v_I = H\omega_0/Qs/s^2 + \omega_0/Qs + \omega_0^2 = R_{56}/R_4 \cdot 1/C_{12}R_{23} \cdot s/s^2 + 1/C_{12}R_{23} \cdot R_{56}/R_1 s + (1/C_{12}R_{23})^2$$

$$\omega_0 = 1/C_{12}R_{23} \quad Q = R_1/R_{56} \quad H = R_{56}/R_4 \qquad \text{(Formula 2)}$$

Frequency characteristics of the transfer function of (Formula 2) are plotted as plot PL1 in FIG. 2. In FIG. 2, the horizontal axis is the angular frequency ω and the vertical axis is the gain Gain.

Now considered is a case where the center frequency φ0 is adjusted by changing the value of resistance R23. The resistance value R23 is not included in the sharpness Q and pass gain H shown in (Formula 2). The frequency characteristics of the case where only the center frequency ω0 is adjusted are plotted as plot PL2 of FIG. 2.

The resistance value R23 in plot PL2 of FIG. 2 is, for example, smaller than the resistance value R23 in plot PL1. Comparing plot PL1 of resistance R23*a* to plot PL2 of resistance R23*b*, the center frequency ω0 shifts to the high frequency side in plot PL2. In other words, when the resistance value R23 is reduced, the center frequency ω0 shifts to the high-frequency side.

As in plot PL2, when only the center frequency ω0 is adjusted, the other parameters (sharpness Q and pass gain H) are not affected. That is, the center frequency ω0 can be adjusted independently.

Similarly, in the case of adjusting the sharpness Q, changing the value of resistance R1 does not affect the parameters of center frequency ω0 and pass gain H. The frequency characteristics when adjusting the sharpness Q are plotted in plot PL3 of FIG. 2. The resistance value R1 in plot PL3 is, for example, greater than the resistance value R1 in plot PL1. As in plot PL3, only the sharpness Q can be adjusted independently.

Similarly, when adjusting the pass-through gain H, the parameters of center frequency ω0 and sharpness Q are not affected by changing the resistance value R4. The frequency characteristics in the case of adjusting the pass gain H are plotted as plot PL4 of FIG. 2. The resistance value R4 in plot PL4 is, for example, smaller than the resistance value R4 in plot PL1. As in plot PL4, only the pass gain H can be adjusted independently.

In FIG. 1, if the signal input to the input terminal VI is vI and the signal output from the output terminal VL is vL, the transfer function as a low-pass filter is (Formula 3).

$$v_L/v_I = H\cdot\omega_0^2/s^2 + \omega_0/Qs + \omega_0^2 = -R_6/R_4 \cdot 1/C_1 C_2 R_2 R_3 \cdot 1/s_2 + 1/C_1 R_3 \cdot R_6/R_1 \cdot s + 1/C_1 C_2 R_2 R_3 \cdot R_6/R_5 \qquad \text{(Formula 3)}$$

Note that, in (Formula 3), ω0 denotes the cutoff frequency, Q denotes the sharpness, and H denotes the pass gain.

In (Formula 3), if C1=C2=C12, R2=R3=R23, R5=R6=R56, the parameters of the transfer function, cutoff frequency ω0, sharpness Q, and pass gain H can be expressed in (Formula 4).

$$v_L/v_I = H\cdot\omega_0^2/s^2 + \omega_0/Qs + \omega_0^2 = R_{56}/R_4 \cdot (1/C_{12}R_{23})^2 \cdot 1/s^2 + 1/C_{12}R_{23} \cdot R_{56}/R_1 s + (1/C_{12}R_{23})^2$$

$$\omega_0 = 1/C_{12}R_{23} \quad Q = R_1/R_{56} \quad H = R_{56}/R_4 \qquad \text{(Formula 4)}$$

Figure 3:
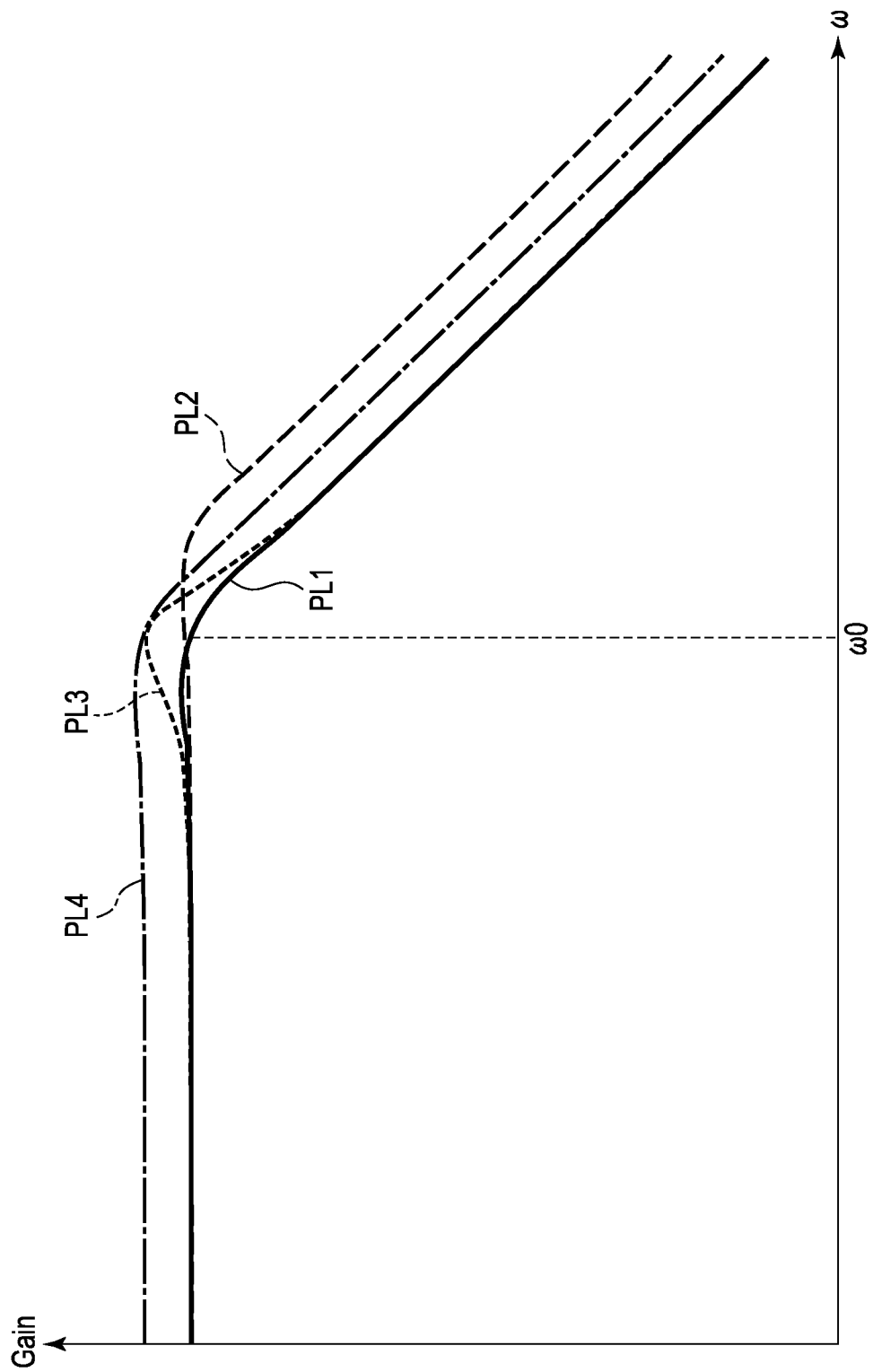
FIG. 3 is a diagram illustrating an operation of the biquad filter of the first embodiment, functioning as a low-pass filter.

FIG. 3 illustrates the operation of the biquad filter FC of the first embodiment as a low-pass filter.

Now considered is a case where the cutoff frequency ω0 is adjusted by changing the resistance value R23. The frequency characteristics of the case where only the cutoff frequency ω0 is adjusted are plotted in plot PL2 of FIG. 3.

The resistance value R23 in plot PL2 is smaller than the resistance value R23 in plot PL1, for example. The resistance value R23 is not included in the formulae for sharpness Q and pass gain H. Therefore, it has no effect on these parameters, and only the cutoff frequency ω0 can be adjusted independently.

Similarly, in the case of adjusting the sharpness Q, by changing the resistance value R1, only the sharpness Q can be adjusted independently without affecting the parameters of cutoff frequency ω0 and pass gain H. The frequency characteristics when adjusting the sharpness Q are plotted in plot PL3 of FIG. 3. The resistance value R1 in plot PL3 is, for example, larger than the resistance value R1 in plot PL1. As in plot PL3, only the sharpness Q can be adjusted independently.

Similarly, when adjusting the pass gain H, by changing the resistance value R4, only the pass-through gain H can be adjusted independently without affecting the parameters of cutoff frequency ω0 and sharpness Q. The frequency characteristics when adjusting the pass-through gain H are plotted in plot PL4 of FIG. 3. The resistance value R4 in plot PL4 is, for example, smaller than the resistance value R4 in plot PL1. As in plot PL4, only the pass gain H can be adjusted independently.

In FIG. 1, if the signal input to the input terminal VI is vI and the signal output from the output terminal VH is vH, the transfer function as a high-pass filter is (Formula 5).

$$v_H/v_I = H\cdot s^2/s^2 + \omega_0/Qs + \omega_0^2 = R_6/R_4 \cdot s^2/s^2 + 1/C_1 R_3 \cdot R_6/R_1 s + 1/C_1 C_2 R_2 R_3 \cdot R_6/R_5 \qquad \text{(Formula 2)}$$

Note that, in (Formula 5), ω0 denotes the cutoff frequency, Q denotes the sharpness, and H denotes the pass gain.

In (Formula 5), if C1=C2=C12, R2=R3=R23, R5=R6=R56, the parameters of the transfer function, cutoff frequency ω0, sharpness Q, and pass gain H can be expressed in (Formula 6).

$$v_H/v_I = H\cdot s^2/s^2 + \omega_0/Qs + \omega_0^2 = -R_{56}/R_4 \cdot s^2/s^2 + 1/C_{12}R_{23} \cdot R_{56}/R_1 s + (1/C_{12}R_{23})^2$$

$$\omega_0 = 1/C_{12}R_{23} \quad Q = R_1/R_{56} \quad H = -R_{56}/R_4 \qquad \text{(Formula 6)}$$

Figure 4:
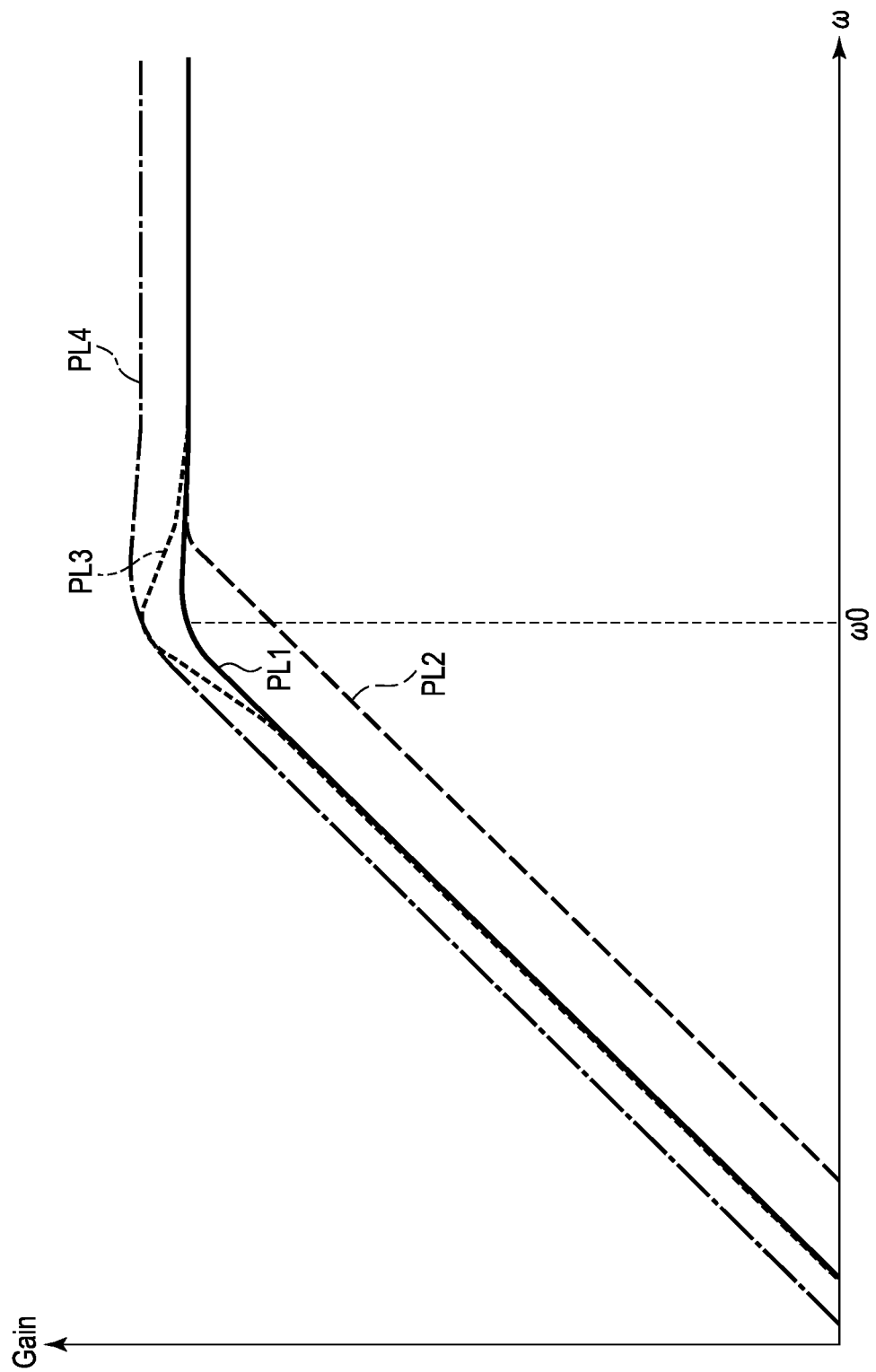
FIG. 4 is a diagram illustrating an operation of the biquad filter of the first embodiment, functioning as a high-pass filter.

FIG. 4 illustrates the operation of the biquad filter FC of the first embodiment as a high-pass filter.

Now considered is the case where the cutoff frequency ω0 is adjusted by changing the resistance value R23. The resistance value R23 is not included in the formula of sharpness Q or pass gain H. Therefore, it has no effect on these parameters, and only the cutoff frequency ω0 can be adjusted independently. The frequency characteristics when only the cutoff frequency ω0 is adjusted are plotted in plot PL2 of FIG. 4. The resistance value R23 in plot PL2 is, for example, smaller than the resistance value R23 in plot PL1. The resistance value R23 is not included in the equations for sharpness Q and pass gain H. Therefore, it has no effect on these parameters, and only the cutoff frequency ω0 can be adjusted independently.

Similarly, in the case of adjusting the sharpness Q, by changing the resistance value R1, only the sharpness Q can be adjusted independently without affecting the parameters of cutoff frequency ω0 and pass gain H. The frequency characteristics when adjusting the sharpness Q are plotted in plot PL3 of FIG. 4. The resistance value R1 in plot PL3 is, for example, larger than the resistance value R1 in plot PL1. As in plot PL3, only the sharpness Q can be adjusted independently.

Similarly, in the case of adjusting the pass gain H, by changing the value of resistance R4, only the pass gain H can be adjusted independently without affecting the parameters of cutoff frequency ω0 and sharpness Q. The frequency characteristics when adjusting the pass gain H is plotted in plot PL4 of FIG. 4. The resistance value R4 in plot PL4 is, for example, smaller than the resistance value R4 in plot PL1. As in plot PL4, only the pass gain H can be adjusted independently.

Figure 5A:
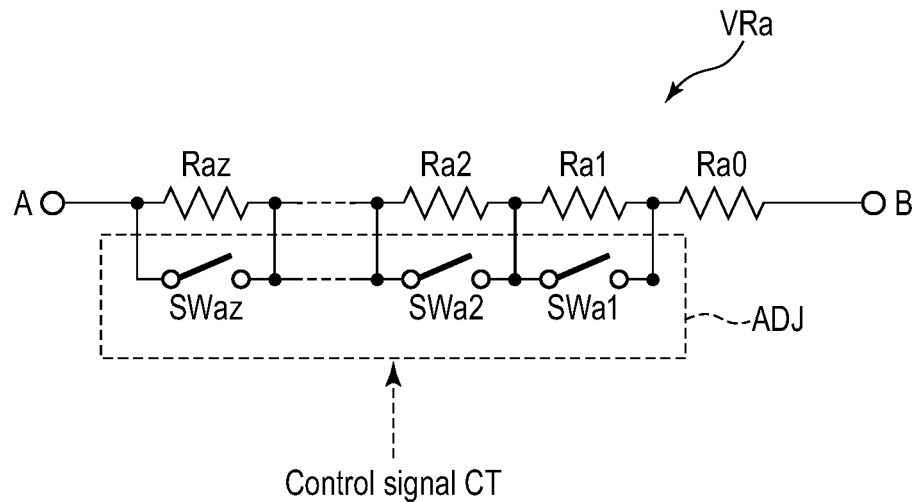
FIG. 5A is a circuit diagram illustrating a variable resistor and an adjustor thereof.
Figure 5B:
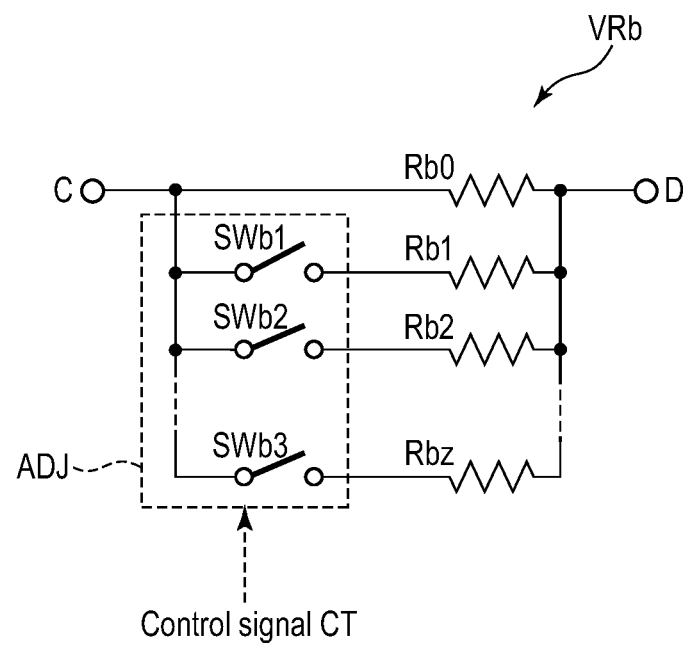
FIG. 5B is a circuit diagram illustrating the variable resistor and the adjustor thereof.

Here, a variable resistor and an adjustor thereof, which change the resistance value of the resistor according to the control signal CT will be explained. FIGS. 5A and 5B illustrate the circuit diagram of the variable resistor and the adjustor thereof. FIG. 5A illustrates the variable resistor and the adjustor thereof when the resistors are connected in series, and FIG. 5B illustrates the variable resistor and the adjustor thereof when the resistors are connected in parallel.

In the example of FIG. 5A, the variable resistor VRa includes resistors Ra0, Ra1, Ra2 to Raz. To each of the series-connected resistors Ra1, Ra2 to Raz, each of the switches Swa1, Swa2 to Swaz is connected in parallel. When a control signal CT is input to the adjustor ADJ, the switch corresponding to the control signal CT is turned on.

For example, when switches SWa1 and SWa2 are in an off state and the other switches are in an on state, the composite resistance value SRa of variable resistor VRa in the example of FIG. 5A is SRa=Ra0+Ra1+Ra2. Thus, by controlling the on-state and off-state of the switches of the adjustor ADJ by the control signal CT, the synthetic resistance value of the variable resistor VRa can be changed.

In the example of FIG. 5B, resistors Rb0, Rb1, Rb2 to Rbz are connected in parallel as described above. To each of the resistors Rb1, Rb2 to Rbz, each of the switches Swb1, Swb2 to Swbz is connected in series. As in FIG. 5A, the switches Swb1, Swb2 to Swbz are referred to as adjustor ADJ. When a control signal CT is input to the adjustor ADJ, the switch corresponding to the control signal CT becomes the on state.

For example, when switches SWb1 and SWb2 are in the on state and the other switches are in the off state, the composite resistance value SRb of variable resistor VRb in the example of FIG. 5B satisfies (1/SRb)=(1/Rb0)+(1/Rb1)+(1/Rb2). Therefore, the composite resistance value SRb is SRb=(Rb0×Rb1×Rb2)/{(Rb1×Rb2)+(Rb0×Rb2)+(Rb0×Rb1)}. By controlling the on-state and off-state of the switch of the adjustor ADJ by the control signal CT, the synthetic resistance value of the variable resistor VRb can be changed.

Note that, in FIGS. 5A and 5B, the cases of connecting resistors in series and in parallel are explained separately, but the variable resistor of the present embodiment is not limited to the above cases. The variable resistor of the present embodiment may include resistors connected in series and in parallel, as well as the adjustors thereof.

In the biquad filter of the present embodiment described above, when adjusting the parameters of frequency ω0 (cutoff frequency ω0 or center frequency ω0), sharpness Q, and pass gain H by changing a predetermined resistance value, there is no need to change the resistance value of a resistor that is not directly related to the parameter to be adjusted. Therefore, each parameter can be adjusted independently.

Example

Figure 6:
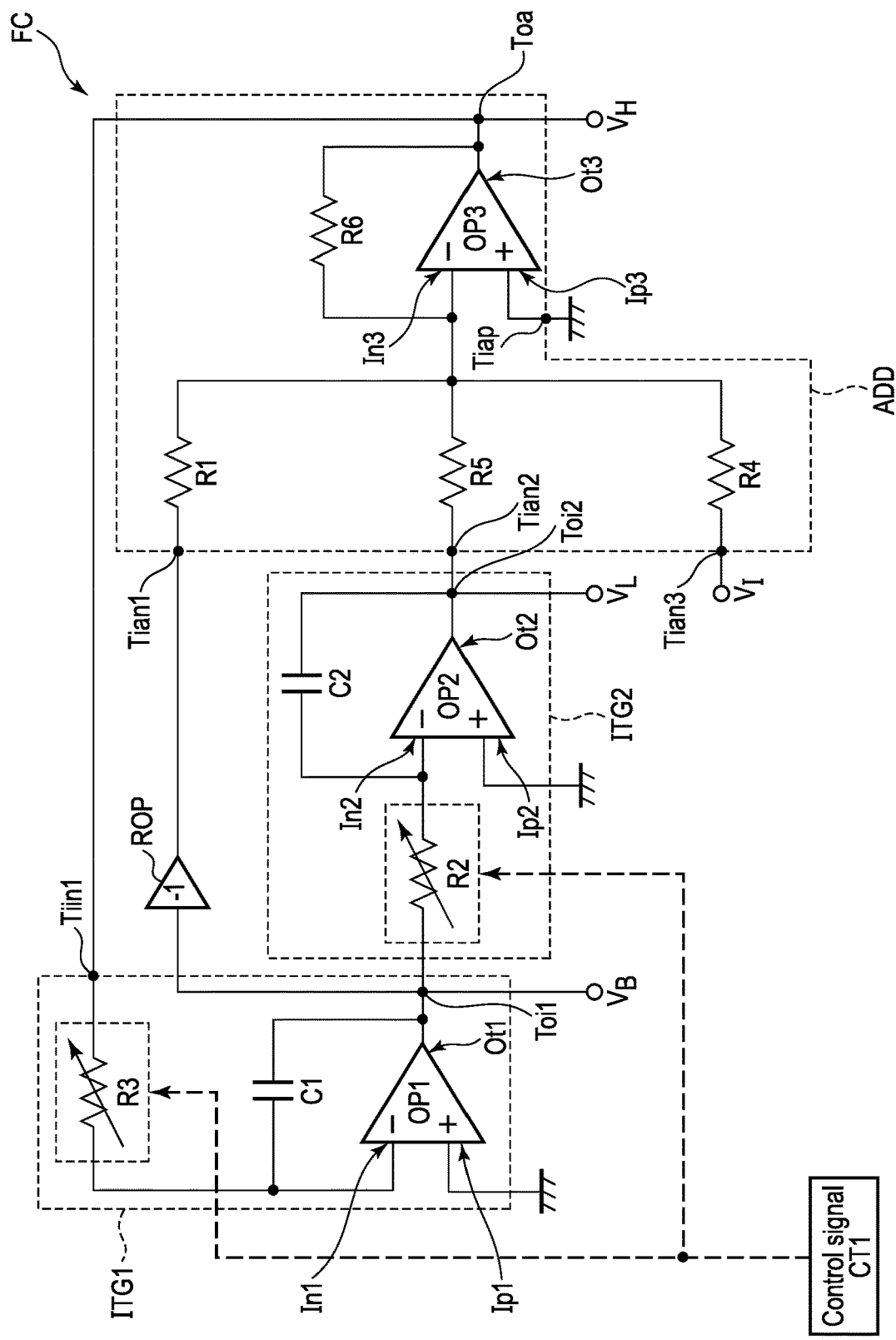
FIG. 6 is a circuit diagram of another example of the structure of the biquad filter of the first embodiment.

FIG. 6 illustrates another example of the structure of the biquad filter of the first embodiment. In the example of FIG. 6, a portion of the variable resistor is a fixed resistor, and this is a difference from the first embodiment.

In the biquad filter FC of FIG. 6, resistors R1, R4, R5, and R6 of FIG. 1 are replaced with fixed resistors. That is, resistors R2 and R3 are variable resistors.

The example of FIG. 6 is suitable for adjusting the frequency ω0 (center frequency or cutoff frequency) mainly independently. As mentioned above, the frequency ω0 can be adjusted by changing the resistors R2 and R3 (R23). That is, in the example shown in FIG. 6, the frequency ω0 can be adjusted without changing the resistance values of the resistors for other parameters.

Second Embodiment

Figure 7:
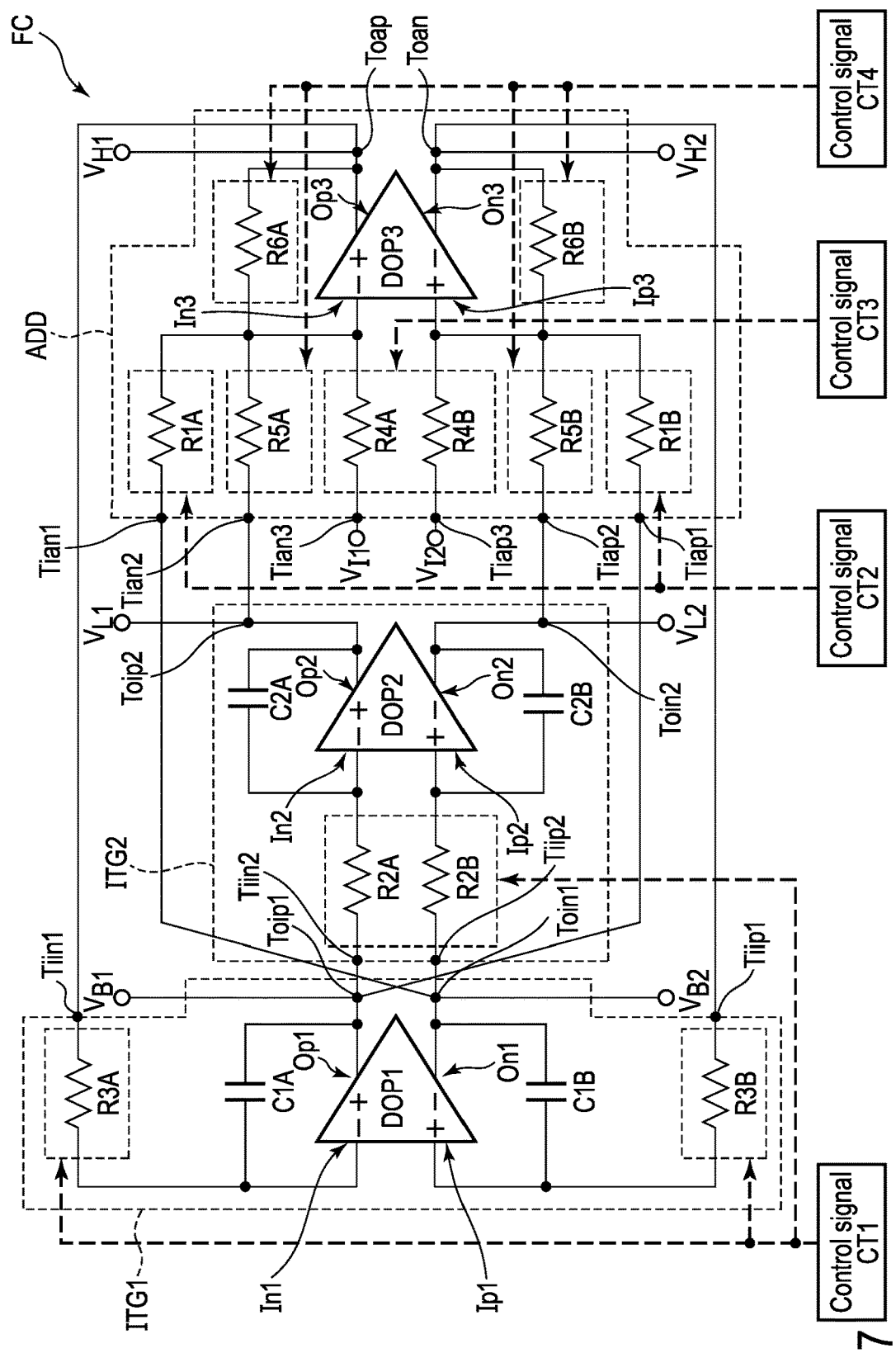
FIG. 7 is a circuit diagram illustrating a biquad filter of a second embodiment.

FIG. 7 is a circuit diagram of the biquad filter of the second embodiment. The biquad filter of FIG. 7 differs from the biquad filter of FIG. 1 in that the whole structure is a differential structure which does not have an inversion amplifier.

The biquad filter FC includes a fully-differential operational amplifier DOP1, fully-differential operational amplifier DOP2, fully-differential operational amplifier DOP3, resistors R1A, R2A, R3A, R4A, R5A, R6A, R1B, R2B, R3B, R4B, R5B, and R6B, condensers C1A, C2A, C1B, and C2B.

The biquad filter FC includes an input terminal VI1 in the positive pole side, input terminal VI2 in the negative pole side, output terminals VB1 in the positive pole side and VB2 in the negative pole side of the band-pass filter, output terminals VL1 in the positive pole side and VL2 in the negative pole side of the low-pass filter, and output terminals VH1 in the positive pole side and VH2 in the negative pole side of the high-pass filter.

The biquad filter FC of the present embodiment includes a first integrator ITG1, second integrator ITG2, and adder ADD. The first integrator ITG1 includes the fully-differential operational amplifier DOP1, resistors R3A and R3B, condensers C1A and C1B. The second integrator ITG2 includes the fully-differential operational amplifier DOP2, resistors R2A and R2B, and condensers C2A and C2B. The adder ADD includes the fully-differential operational amplifier DOP3, resistors R1A, R4A, R5A, R6A, R1B, R4B, R6A, R5AB, and R6A.

The output terminal Toip1 in the positive pole side of the first integrator ITG1 is connected to the output terminal VB1. The output terminal Toip1 in the positive pole side of the first integrator ITG1 is connected to the input terminal Tiin2 in the negative pole side of the second integrator ITG2. The output terminal Toip1 in the positive pole side of the first integrator ITG1 is connected to the first input terminal Tiap1 in the positive pole side of the adder ADD.

The output terminal Toin1 in the negative pole side of the first integrator ITG1 is connected to the output terminal VB2. The output terminal Toin1 in the negative pole side of the first integrator ITG1 is connected to the input terminal Tiip2 in the positive pole side of the second integrator ITG2. The output terminal Toin1 in the negative pole side of the first integrator ITG1 is connected to the first input terminal Tian1 in the negative pole side of the adder ADD.

The output terminal Toip2 in the positive pole side of the second integrator ITG2 is connected to the output terminal VL1, and the output terminal Toip2 in the positive pole side of the second integrator ITG2 is connected to the second input terminal Tian2 in the negative pole side of the adder ADD.

The output terminal Toin2 in the negative pole side of the second integrator ITG2 is connected to the output terminal VL2. The output terminal Toin2 in the negative pole side of the second integrator ITG2 is connected to the second input terminal Tiap2 in the positive pole side of the adder.

The input terminal VI1, to which one of the positive or reverse phases of the differential input signal is input, is connected to the third input terminal Tian3 in the negative pole side of the adder ADD. The input terminal VI2, to which the other of the positive or reverse phases of the differential input signal is input, is connected to the third input terminal Tiap3 in the positive pole side of the adder ADD. The input terminals VI1 and VI2 may be referred to as the first and second input terminals of the biquad filter FC, respectively.

The positive output terminal Toap of the adder ADD is connected to the output terminal VH1. The output terminal Toap in the positive pole side of the adder ADD is connected to the input terminal Tiin1 in the negative pole side of the first integrator ITG1. The output terminal Toan in the negative pole side of the adder ADD is connected to the output terminal VH2. The output terminal Toan in the negative pole side of the adder ADD is connected to the input terminal Tiip1 in the positive pole side of the first integrator ITG1.

In the biquad filter FC, the resistors R1A, R2A, R3A, R4A, R5A, R6A, R1B, R2B, R3B, R4B, R5B, and R6B are variable resistors. The resistors R2A, R3A, R2B, and R3B change resistance values thereof based on the control signal CT1. The resistors R1A and R1B change resistance values thereof based on the control signal CT2. The resistors R4A and R4B change resistance values thereof based on the control signal CT3. The resistors R5A, R6A, R5B, and R6B change resistance values thereof based on the control signal CT4.

In the present embodiment, the fully-differential operational amplifier DOP1 will be referred to as first fully-differential operational amplifier. The resistors R3A and R3B, which are variable resistors, will collectively be referred to as first variable resistor. The condensers C1A and C1B will collectively be referred to as first condenser.

The fully-differential operational amplifier DOP2 will be referred to as second fully-differential operational amplifier. The resistors R2A and R2B, which are variable resistors, will collectively be referred to as second variable resistor. The condensers C2A and C2B will collectively be referred to as second condenser.

The fully-differential operational amplifier DOP3 will be referred to as third fully-differential operational amplifier. The resistors R1A and R1B may be referred to as first resistor of the adder ADD, resistors R5A and R5B may be referred to as second resistor of the adder ADD, resistors R4A and R4B may be referred to as third resistor of the adder ADD, and resistors R6A and R6B may be referred to as fourth resistor of the adder ADD.

The output terminal VB1 in the positive pole side and the output terminal VB2 in the negative pole side of the band-pass filter may be referred to as the output terminals of the band-pass filter. The output terminal VL1 in the positive pole side and the output terminal VL2 in the negative pole side of the low-pass filter may be referred to as the output terminals of the low-pass filter. The output terminal VH1 in the positive pole side and the output terminal VH2 in the negative pole side of the high-pass filter may be referred to as the output terminals of the high-pass filter.

Note that, in a case where resistors, condensers, or output terminals must be distinguished, for example, the resistor R3A is the first variable resistor, and the resistor R3B is the third variable resistor. For the resistors R2A and R2B, the resistor R2A is the second variable resistor, and the resistor R2B is the fourth variable resistor. Similarly, the condenser C1A and C2A are the first condenser and second condenser, respectively, and the condenser C1B and C2B are the third condenser and fourth condenser, respectively.

The resistors R1A, R5A, R4A, R6A, R4B, R5B, R1B, and R6B may be referred to as fifth, sixth, seventh, eighth, ninth, tenth, eleventh, and twelfth resistors, respectively.

Specifically, the positive output terminal Op1 of the fully-differential operational amplifier DOP1 is connected to one terminal of the resistor R2A, one terminal of the condenser C1A, one terminal of the resistor R1B, and output terminal VB1. The output terminal On1 in the negative side of the fully-differential operational amplifier DOP1 is connected to one terminal of the resistor R2B, one terminal of the condenser C1B, one terminal of the resistor R1A, and output terminal VB2.

The input terminal Ip1 in the positive pole side of the fully-differential operational amplifier DOP1 is connected to the other terminal of the condenser C1B and one terminal of the resistor R3B. The input terminal In1 in the negative pole side of amplifier DOP1 is connected to the other terminal of condenser C1A and one terminal of resistor R3A.

The output terminal Op2 in the positive side of the fully-differential operational amplifier DOP2 is connected to the output terminal VL1, one terminal of the condenser C2A, and one terminal of the resistor R5A. The output terminal On2 in the negative pole side of the operational amplifier DOP2 is connected to the output terminal VL2, one terminal of the condenser C2B, and one terminal of the resistor R5B.

The input terminal Ip2 in the positive pole side of the fully-differential operational amplifier DOP2 is connected to the other terminal of the condenser C2B and the other terminal of the resistor R2B. The input terminal In2 in the negative pole side of amplifier DOP2 is connected to the other terminal of condenser C2A and the other terminal of resistor R2A.

The output terminal Op3 in the positive pole side of the fully-differential operational amplifier DOP3 is connected to the output terminal VH1, one terminal of the resistor R6A, and the other terminal of the resistor R3A. The output terminal On3 in the negative pole side of the amplifier DOP3 is connected to the output terminal VH2, one terminal of the resistor R6B, and the other terminal of the resistor R3B.

The input terminal Ip3 in the positive side of the fully-differential operational amplifier DOP3 is connected to the other terminal of the resistor R1B, the other terminal of the resistor R5B, one terminal of the resistor R4B, and the other terminal of the resistor R6B. The input terminal In3 in the negative pole side of the differential operational amplifier DOP3 is connected to the other terminal of resistor R1A, the other terminal of resistor R5A, one terminal of resistor R4A, and the other terminal of resistor R6A.

The other terminal of resistor R4A is connected to the input terminal VI1. The other terminal of resistor R4B is connected to the input terminal VI2.

The positive output terminal Toip1 of the first integrator ITG1 is connected to the output terminal Op1 in the positive pole side of the fully-differential operational amplifier DOP1, one terminal of the resistor R2A, one terminal of the condenser C1A, one terminal of the resistor R1B, and the output terminal VB1. The output terminal Toin1 in the negative pole side of the first integrator ITG1 is connected to the output terminal On1 in the negative pole side of the fully-differential operational amplifier DOP1, one terminal of the resistor R2B, one terminal of the condenser C1B, one terminal of the resistor R1A, and the output terminal VB2.

The input terminal Tiip1 in the positive pole side of the first integrator ITG1 includes the other terminal of the resistor R3B and is connected to the input terminal Ip1 in the positive pole side of the fully-differential operational amplifier DOP1 via the resistor R3B. The input terminal Tiin1 in the negative pole side of the first integrator ITG1 includes the other terminal of resistor R3A and is connected to the input terminal In1 in the negative pole side of fully-differential operational amplifier DOP1 via the resistor R3A.

The output terminal Toip2 in the positive pole side of the second integrator ITG2 is connected to the output terminal Op2 in the positive pole side of the fully-differential operational amplifier DOP2, the output terminal VL1, one terminal of the condenser C2A, and one terminal of the resistor R5A. The output terminal Toin2 in the negative pole side of the second integrator ITG2 is connected to the output terminal On2 in the negative pole side of the fully-differential operational amplifier DOP2, output terminal VL2, one terminal of condenser C2B, and one terminal of resistor R5B.

The input terminal Tiip2 in the positive pole side of the second integrator ITG2 includes one terminal of the resistor R2B and is connected to the input terminal Ip2 in the positive pole side of the fully-differential operational amplifier DOP2 via the resistor R2B. The input terminal Tiin2 in the negative pole side of the second integrator ITG2 includes one terminal of resistor R2A, and is connected to the input terminal In2 in the negative pole side of the fully-differential operational amplifier DOP2 via the resistor R2A. The positive output terminal Toap of the adder ADD is connected to the output terminal Op3 in the positive pole side of the fully-differential operational amplifier DOP3, the output terminal VH1, one terminal of the resistor R6A, and the other terminal of the resistor R3A.

The negative output terminal Toan of the adder ADD is connected to the output terminal On3 in the negative pole side of the fully-differential operational amplifier DOP3, the output terminal VH2, one terminal of the resistor R6B, and the other terminal of the resistor R3B.

The first input terminal Tiap1 in the positive pole side of the adder ADD includes one terminal of the resistor R1B and is connected to the input terminal Ip3 in the positive pole side of the fully-differential operational amplifier DOP3 via the resistor R1B. The second input terminal Tiap2 in the positive pole side of the adder ADD includes one terminal of the resistor R5B and is connected to the input terminal Ip3 in the positive pole side of the fully-differential operational amplifier DOP3 via the resistor R5B. The third input terminal Tiap3 in the positive pole side of the adder ADD includes the other terminal of the resistor R4B and is connected to the input terminal Ip3 in the positive pole side of the fully-differential operational amplifier DOP3 through the resistor R4B.

The first input terminal Tian1 in the negative pole side of the adder ADD includes one terminal of the resistor R1A and is connected to the input terminal In3 in the negative pole side of the fully-differential operational amplifier DOP3 via the resistor R1A. The second input terminal Tian2 in the negative pole side of the adder ADD includes one terminal of the resistor R5A and is connected to the input terminal In3 in the negative pole side of the fully-differential operational amplifier DOP3 via the resistor R5A. The third input terminal Tian3 in the negative pole side of the adder ADD includes the other terminal of the resistor R4A and is connected to the input terminal In3 in the negative pole side of the fully-differential operational amplifier DOP3 through the resistor R4A.

The output terminal Toip1 in the positive pole side of the first integrator ITG1, output terminal Toip2 in the positive pole side of the second integrator ITG2, and output terminal Toap in the positive pole side of the adder ADD can be interpreted to include the output terminal Op1 in the positive pole side of the fully-differential operational amplifier DOP1, output terminal Op2 in the positive pole side of the fully-differential operational amplifier DOP2, and output terminal Op3 in the positive pole side of the fully-differential operational amplifier DOP3, respectively.

The output terminal Toin1 in the negative pole side of the first integrator ITG1, output terminal Toin2 in the negative pole side of the second integrator ITG2, and output terminal Toan in the negative pole side of the adder ADD can be interpreted to include the output terminal On1 in the negative pole side of the fully-differential operational amplifier DOP1, output terminal On2 in the negative pole side of the fully-differential operational amplifier DOP2, and output terminal On3 of the fully-differential operational amplifier DOP3, respectively.

This is because, the signals output from the output terminals in the positive and negative pole sides of the first integrator ITG1, second integrator ITG2, and adder ADD are equivalent to the signals output from the output terminals in the positive and negative pole sides of the fully-differential operational amplifier DOP1, fully-differential operational amplifier DOP2, and fully-differential operational amplifier DOP3, respectively.

In FIG. 7, the difference signal between the signal input to the input terminal VI1 and the signal input to the input terminal VI2 is denoted as vI. The difference signal between the signal output from output terminal VB1 and the signal output from output terminal VB2 is denoted as vB. The difference signal between the signal output from output terminal VL1 and the signal output from output terminal VL2 is vL. The difference signal between the signal output from the output terminal VH1 and the signal output from the output terminal VH2 is vH.

Furthermore, if R1A=R1B=R1, R2A=R2B=R2, R3A=R3B=R3, R4A=R4B=R4, R5A=R5B=R5, R6A=R6B=R6, C1A=C1B=C1, C2A=C2B=C2, the transfer function as a band-pass filter is the same as (Formula 1) in the above embodiment. The transfer function as a low-pass filter is the same as (Formula 3), and the transfer function as a high-pass filter is the same as (Formula 5).

In the present embodiment, as in the first embodiment, when adjusting the parameters of frequency $\omega 0$, sharpness Q, and pass gain H by changing a predetermined resistance value, each parameter can be adjusted independently without changing the resistance value of the resistance that is not directly related to the parameter to be adjusted.

Examples of the biquad filter achieved by the structures of the present application will be noted as follows.

(1) A biquad filter comprising:

a first integrator including a first operational amplifier, and a first variable resistor and a first condenser connected to the first operational amplifier;

a second integrator including a second operational amplifier, and a second variable resistor and a second condenser connected to the second operational amplifier;

an adder including a third operational amplifier and a plurality of resistors connected to the third operational amplifier; and an inversion amplifier having a 1× amplification rate, wherein an output terminal of the first integrator is connected to an input terminal in a negative pole side of the second integrator, the output terminal of the first integrator is connected to a first input terminal in a negative pole side of the adder through the inversion amplifier, an output terminal of the second integrator is connected to a second input terminal in the negative pole side of the adder, an input terminal to which an input signal is input is connected to a third input terminal in the negative side of the adder, and an output terminal of the adder is connected to an input terminal in a negative pole side of the first integrator.

(2) The biquad filter according to item (1), wherein the output terminal of the first integrator is connected to an output terminal of a band-pass filter.

(3) The biquad filter according to item (1), wherein the output terminal of the second integrator is connected to an output terminal of a low-pass filter.

(4) The biquad filter according to item (1), wherein the output terminal of the adder is connected to an output terminal of a high-pass filter.

(5) The biquad filter according to any one according to items (1) to (4), wherein the resistors of the adder are variable resistors.

(6) The biquad filter according to item (1), wherein the adder includes a third resistor, a fourth resistor, a fifth resistor, and a sixth resister, an output terminal of the first operational amplifier is connected to one terminal of the first condenser, one terminal of the second variable resistor, an input terminal of the inversion amplifier, and an output terminal of the band-pass filter, an input terminal in the negative pole side of the first operational amplifier is connected to the other terminal of the first condenser, and one terminal of the first variable resistor, an output terminal of the second operational amplifier is connected to one terminal of the second condenser, one terminal of the fourth resistor, and an output terminal of the low-pass filter, an input terminal in the negative pole side of the second operational amplifier is connected to the other terminal of the second variable resistor, and the other terminal of the second condenser, an output terminal of the third operational amplifier is connected to one terminal of the sixth resistor, the other terminal of the first variable resistor, and an output terminal of the high-pass filter, an input terminal in the negative pole side of the third operational amplifier is connected to the other terminal of the sixth resistor, the other terminal of the fourth resistor, one terminal of the fifth resistor, and one terminal of the third resistor, an output terminal of the inversion amplifier is connected to the other terminal of the third resistor, and the other terminal of the fourth resistor is connected to the input terminal to which the input signal is input.

(7) The biquad filter according to item (6), wherein the output terminals of the first integrator, second integrator, and adder include the output terminals of the first operational amplifier, second operational amplifier, and third operational amplifier, respectively, the input terminal in the negative pole side of the first integrator includes the other terminal of the first variable resistor, the input terminal in the negative pole side of the second integrator includes one terminal of the second variable resistor, and a first input terminal in the negative pole side of the adder includes the other terminal of the third resistor, a second input terminal in the negative pole side of the adder includes one terminal of the fourth resistor, and a third input terminal in the negative pole side of the adder includes the other terminal of the fifth resistor.

(8) The biquad filter according to item (1), wherein input terminals in positive pole sides of the first integrator, the second integrator, and the adder are grounded.

(9) A biquad filter, comprising:

a first integrator including a first fully-differential operational amplifier, a first variable resistor connected to the first fully-differential operational amplifier, and a first condenser connected to the first fully-differential operational amplifier;

a second integrator including a second fully-differential operational amplifier, a second variable resistor connected to the second fully-differential operational amplifier, and a second condenser connected to the second fully-differential operational amplifier; and an adder including a third fully-differential operational amplifier and a plurality of resistors connected to the third fully-differential operational amplifier, wherein an output terminal in a positive pole side of the first integrator is connected to an input terminal in a negative pole side of the second integrator, an output terminal in a positive pole side of the second integrator is connected to a first input in a positive pole side of the adder, an output terminal in a negative pole side of the first integrator is connected to an input terminal in a positive pole side of the second integrator, an output terminal in a negative pole side of the first integrator is connected to a first input terminal in a negative pole side of the adder, an output terminal in a positive pole side of the second integrator is connected to a second input terminal in the negative pole side of the adder, an output terminal in a negative pole side of the second integrator is connected to a second input terminal in the positive pole side of the adder, a first input terminal to which one of positive phase and negative phase of differential input signals is input is connected to a third input terminal in the negative pole side of the adder, a second input terminal to which the other one of the positive phase and negative phase of differential input signals is connected to a third input terminal in the positive pole side of the adder, an output terminal in the positive pole side of the adder is connected to an input terminal in a positive pole side of the first integrator, and an output terminal in the negative pole side of the adder is connected to an input terminal in a positive pole side of the first integrator.

(10) The biquad filter according to item (9), wherein the output terminals of the positive and negative pole sides of the first integrator are connected to an output terminal of a band-pass filter.

(11) The biquad filter according to item (9), wherein the output terminals of the positive and negative pole sides of the second integrator are connected to an output terminal of a low-pass filter.

(12) The biquad filter according to item (9), wherein the output terminals of the positive and negative pole sides of the adder are connected to an output terminal of a high-pass filter.

(13) The biquad filter according to any one according to items (9) to (12), wherein the resistors of the adder are variable resistors.

(14) The biquad filter according to item (9), wherein the first integrator includes a third condenser and a third variable resistor, the second integrator includes a fourth condenser and a fourth variable resistor, the adder includes a fifth resistor, a sixth resistor, a seventh resistor, an eighth resistor, a ninth resistor, a tenth resistor, an eleventh resistor, and a twelfth resistor;

an output terminal in a positive pole side of the first fully-differential operational amplifier is connected to one terminal of the second variable resistor, one terminal of the first condenser, one terminal of the eleventh resistor, and an output terminal in a positive pole side of the band-pass filter;

an output terminal in a negative pole side of the first fully-differential operational amplifier is connected to one terminal of the fourth variable resistor, one terminal of the third condenser, one terminal of the fifth resistor, and an output terminal in a negative pole side of the band-pass filter;

an input terminal in the positive pole side of the first fully-differential operational amplifier is connected to the other terminal of the third condenser and one terminal of the third resistor;

an input terminal in the negative pole side of the first fully-differential operational amplifier is connected to the other terminal of the first condenser and one terminal of the first variable resistor;

an output terminal in a positive pole side of the second fully-differential operational amplifier is connected to one terminal of the second condenser, one terminal of the sixth resistor, and an output terminal in a positive pole side of the low-pass filter;

an output terminal in a negative pole side of the second fully-differential operational amplifier is connected to one terminal of the fourth condenser, one terminal of the tenth resistor, and an output terminal in a negative pole side of the low-pass filter;

an input terminal in the positive pole side of the second fully-differential operational amplifier is connected to the other terminal of the fourth condenser, and the other terminal of the fourth variable resistor;

an input terminal in the negative pole side of the second fully-differential operational amplifier is connected to the other terminal of the second condenser, and the other terminal of the second variable resistor;

an output terminal in a positive pole side of the third fully-differential operational amplifier is connected to one terminal of the eighth resistor, the other terminal of the first variable resistor, and an output terminal in a positive pole side of the high-pass filter;

an output terminal in a negative pole side of the third fully-differential operational amplifier is connected to one terminal of the twelfth resistor, the other terminal of the third resistor, and an output terminal in a negative pole side of the high-pass filter;

an output terminal in the positive pole side of the third fully-differential operational amplifier is connected to one terminal of the ninth resistor, the other terminal of the tenth resistor, the other terminal of the eleventh resistor, and the other terminal of the twelfth resistor;

an input terminal in the negative pole side of the third fully-differential operational amplifier is connected to the other terminal of the fifth resistor, the other terminal of the sixth resistor, one terminal of the seventh resistor, and the other terminal of the eighth resistor;

the other terminal of the seventh resistor is connected to the first input terminal to which one of positive and negative phases of the differential input signals is input, and the other terminal of the ninth resistor is connected to the second input terminal to which the other of the positive and negative phases of the differential input signals is input.

(15) The biquad filter according to item (14), wherein the output terminals in the positive and negative pole sides of the first integrator, the output terminals in the positive and negative pole sides of the second integrator, and the output terminals in the positive and negative pole sides of the adder include the output terminals in the positive and negative pole sides of the first fully-differential operational amplifier, the output terminals in the positive and negative pole sides of the second fully-differential operational amplifier, and the output terminals in the positive and negative pole sides of the third fully-differential operational amplifier, respectively, the input terminal in the positive pole side of the first integrator includes the other terminal of the third variable resistor, and the input terminal in the negative pole side of the first integrator includes the other terminal of the first variable resistor, the input terminal in the positive pole side of the second integrator includes one terminal of the fourth variable resistor, and the input terminal in the negative pole side of the second integrator includes one terminal of the second variable resistor, a first input terminal in the positive pole side of the adder includes one terminal of the eleventh resistor, a second input terminal in the positive pole side of the adder includes one terminal of the tenth resistor, and a third input terminal in the positive pole side of the adder includes the other terminal of the ninth resistor, and a first input terminal in the negative pole side of the adder includes one terminal of the fifth resistor, a second input terminal in the negative pole side of the adder includes one terminal of the sixth resistor, and a third input terminal in the negative pole side of the adder includes the other terminal of the seventh resistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A biquad filter comprising:
a first integrator including a first operational amplifier, and a first variable resistor and a first condenser connected to the first operational amplifier;

a second integrator including a second operational amplifier, and a second variable resistor and a second condenser connected to the second operational amplifier;
an adder including a third operational amplifier and a plurality of resistors connected to the third operational amplifier; and
an inversion amplifier with an amplification rate of 1 time, wherein
an output terminal of the first integrator is connected to an input terminal in a negative pole side of the second integrator,
the output terminal of the first integrator is connected to a first input terminal in a negative pole side of the adder through the inversion amplifier,
an output terminal of the second integrator is connected to a second input terminal in the negative pole side of the adder,
an input terminal to which an input signal is input is connected to a third input terminal in the negative side of the adder, and
an output terminal of the adder is connected to an input terminal in a negative pole side of the first integrator,
the adder includes a third resistor, a fourth resistor, a fifth resistor, and a sixth resistor,
an output terminal of the first operational amplifier is connected to one terminal of the first condenser, one terminal of the second variable resistor, an input terminal of the inversion amplifier, and an output terminal of a band-pass filter,
an input terminal in the negative pole side of the first operational amplifier is connected to the other terminal of the first condenser, and one terminal of the first variable resistor,
an output terminal of the second operational amplifier is connected to one terminal of the second condenser, one terminal of the fourth resistor, and an output terminal of a low-pass filter,
an input terminal in the negative pole side of the second operational amplifier is connected to the other terminal of the second variable resistor, and the other terminal of the second condenser,
an output terminal of the third operational amplifier is connected to one terminal of the sixth resistor, the other terminal of the first variable resistor, and an output terminal of a high-pass filter,
an input terminal in the negative pole side of the third operational amplifier is connected to the other terminal of the sixth resistor, the other terminal of the fourth resistor, one terminal of the fifth resistor, and one terminal of the third resistor,
an output terminal of the inversion amplifier is connected to the other terminal of the third resistor, and
the other terminal of the fourth resistor is connected to the input terminal to which the input signal is input.

2. The biquad filter according to claim 1, wherein the output terminal of the first integrator is connected to an output terminal of the band-pass filter.

3. The biquad filter according to claim 1, wherein the output terminal of the second integrator is connected to an output terminal of the low-pass filter.

4. The biquad filter according to claim 1, wherein the output terminal of the adder is connected to an output terminal of the high-pass filter.

5. The biquad filter according to claim 1, wherein the resistors of the adder are variable resistors.

6. The biquad filter according to claim 1, wherein
the output terminals of the first integrator, second integrator, and adder include the output terminals of the first operational amplifier, second operational amplifier, and third operational amplifier, respectively,
the input terminal in the negative pole side of the first integrator includes the other terminal of the first variable resistor,
the input terminal in the negative pole side of the second integrator includes one terminal of the second variable resistor, and
a first input terminal in the negative pole side of the adder includes the other terminal of the third resistor, a second input terminal in the negative pole side of the adder includes one terminal of the fourth resistor, and a third input terminal in the negative pole side of the adder includes the other terminal of the fifth resistor.

7. The biquad filter according to claim 1, wherein input terminals in positive pole sides of the first integrator, the second integrator, and the adder are grounded.

8. A biquad filter, comprising:
a first integrator including a first fully-differential operational amplifier, a first variable resistor connected to the first fully-differential operational amplifier, and a first condenser connected to the first fully-differential operational amplifier;
a second integrator including a second fully-differential operational amplifier, a second variable resistor connected to the second fully-differential operational amplifier, and a second condenser connected to the second fully-differential operational amplifier; and
an adder including a third fully-differential operational amplifier and a plurality of resistors connected to the third fully-differential operational amplifier, wherein
an output terminal in a positive pole side of the first integrator is connected to an input terminal in a negative pole side of the second integrator,
an output terminal in a positive pole side of the second integrator is connected to a first input in a positive pole side of the adder,
an output terminal in a negative pole side of the first integrator is connected to an input terminal in a positive pole side of the second integrator,
an output terminal in a negative pole side of the first integrator is connected to a first input terminal in a negative pole side of the adder,
an output terminal in a positive pole side of the second integrator is connected to a second input terminal in the negative pole side of the adder,
an output terminal in a negative pole side of the second integrator is connected to a second input terminal in the positive pole side of the adder,
a first input terminal to which one of positive phase and negative phase of differential input signals is input is connected to a third input terminal in the negative pole side of the adder,
a second input terminal to which the other one of the positive phase and negative phase of differential input signals is connected to a third input terminal in the positive pole side of the adder,
an output terminal in the positive pole side of the adder is connected to an input terminal in a positive pole side of the first integrator, and
an output terminal in the negative pole side of the adder is connected to an input terminal in a positive pole side of the first integrator.

9. The biquad filter according to claim 8, wherein the output terminals of the positive and negative pole sides of the first integrator are connected to an output terminal of a band-pass filter.

10. The biquad filter according to claim 8, wherein the output terminals of the positive and negative pole sides of the second integrator are connected to an output terminal of a low-pass filter.

11. The biquad filter according to claim 8, wherein the output terminals of the positive and negative pole sides of the adder are connected to an output terminal of a high-pass filter.

12. The biquad filter according to claim 8, wherein the resistors of the adder are variable resistors.

13. The biquad filter according to claim 8, wherein
the first integrator includes a third condenser and a third variable resistor,
the second integrator includes a fourth condenser and a fourth variable resistor,
the adder includes a fifth resistor, a sixth resistor, a seventh resistor, an eighth resistor, a ninth resistor, a tenth resistor, an eleventh resistor, and a twelfth resistor;
an output terminal in a positive pole side of the first fully-differential operational amplifier is connected to one terminal of the second variable resistor, one terminal of the first condenser, one terminal of the eleventh resistor, and an output terminal in a positive pole side of a band-pass filter;
an output terminal in a negative pole side of the first fully-differential operational amplifier is connected to one terminal of the fourth variable resistor, one terminal of the third condenser, one terminal of the fifth resistor, and an output terminal in a negative pole side of the band-pass filter;
an input terminal in the positive pole side of the first fully-differential operational amplifier is connected to the other terminal of the third condenser and one terminal of the third resistor;
an input terminal in the negative pole side of the first fully-differential operational amplifier is connected to the other terminal of the first condenser and one terminal of the first variable resistor;
an output terminal in a positive pole side of the second fully-differential operational amplifier is connected to one terminal of the second condenser, one terminal of the sixth resistor, and an output terminal in a positive pole side of a low-pass filter;
an output terminal in a negative pole side of the second fully-differential operational amplifier is connected to one terminal of the fourth condenser, one terminal of the tenth resistor, and an output terminal in a negative pole side of the low-pass filter;
an input terminal in the positive pole side of the second fully-differential operational amplifier is connected to the other terminal of the fourth condenser, and the other terminal of the fourth variable resistor;
an input terminal in the negative pole side of the second fully-differential operational amplifier is connected to the other terminal of the second condenser, and the other terminal of the second variable resistor;
an output terminal in a positive pole side of the third fully-differential operational amplifier is connected to one terminal of the eighth resistor, the other terminal of the first variable resistor, and an output terminal in a positive pole side of a high-pass filter;
an output terminal in a negative pole side of the third fully-differential operational amplifier is connected to one terminal of the twelfth resistor, the other terminal of the third resistor, and an output terminal in a negative pole side of the high-pass filter;
an output terminal in the positive pole side of the third fully-differential operational amplifier is connected to one terminal of the ninth resistor, the other terminal of the tenth resistor, the other terminal of the eleventh resistor, and the other terminal of the twelfth resistor;
an input terminal in the negative pole side of the third fully-differential operational amplifier is connected to the other terminal of the fifth resistor, the other terminal of the sixth resistor, one terminal of the seventh resistor, and the other terminal of the eighth resistor;
the other terminal of the seventh resistor is connected to the first input terminal to which one of positive and negative phases of the differential input signals is input, and
the other terminal of the ninth resistor is connected to the second input terminal to which the other of the positive and negative phases of the differential input signals is input.

14. The biquad filter according to claim 13, wherein
the output terminals in the positive and negative pole sides of the first integrator, the output terminals in the positive and negative pole sides of the second integrator, and the output terminals in the positive and negative pole sides of the adder include the output terminals in the positive and negative pole sides of the first fully-differential operational amplifier, the output terminals in the positive and negative pole sides of the second fully-differential operational amplifier, and the output terminals in the positive and negative pole sides of the third fully-differential operational amplifier, respectively,
the input terminal in the positive pole side of the first integrator includes the other terminal of the third variable resistor, and the input terminal in the negative pole side of the first integrator includes the other terminal of the first variable resistor,
the input terminal in the positive pole side of the second integrator includes one terminal of the fourth variable resistor, and the input terminal in the negative pole side of the second integrator includes one terminal of the second variable resistor,
a first input terminal in the positive pole side of the adder includes one terminal of the eleventh resistor, a second input terminal in the positive pole side of the adder includes one terminal of the tenth resistor, and a third input terminal in the positive pole side of the adder includes the other terminal of the ninth resistor, and
a first input terminal in the negative pole side of the adder includes one terminal of the fifth resistor, a second input terminal in the negative pole side of the adder includes one terminal of the sixth resistor, and a third input terminal in the negative pole side of the adder includes the other terminal of the seventh resistor.

* * * * *